United States Patent [19]

Aling

[11] 4,236,153
[45] Nov. 25, 1980

[54] CHARACTER DISPLAY DEVICE

[75] Inventor: Willem Aling, Eindhoven, Netherlands

[73] Assignee: U.S. Philips Corporation, New York, N.Y.

[21] Appl. No.: 881,632

[22] Filed: Feb. 27, 1978

Related U.S. Application Data

[63] Continuation of Ser. No. 683,286, May 5, 1976, abandoned.

[30] Foreign Application Priority Data

May 9, 1975 [NL] Netherlands ......................... 7505452

[51] Int. Cl.³ .............................................. G09G 3/04
[52] U.S. Cl. ................................... 340/756; 340/802; 340/814
[58] Field of Search ................ 340/336, 756, 802, 814

[56] References Cited

U.S. PATENT DOCUMENTS

| | | | |
|---|---|---|---|
| 1,769,060 | 7/1930 | Hendry | 340/339 |
| 3,400,388 | 9/1968 | Blank | 340/336 X |
| 3,587,084 | 6/1971 | Schmidhauser | 340/814 |
| 3,943,500 | 3/1976 | Buchanan | 340/336 X |
| 3,973,254 | 8/1976 | Nomiya et al. | 340/802 |

Primary Examiner—David L. Trafton
Attorney, Agent, or Firm—Thomas A. Broidy; Jack Oisher; James J. Cannon, Jr.

[57] ABSTRACT

A low-noise character element display device is obtained by periodically gradually switching on and off of the display elements and by changing the information to be displaced at instants that the display elements are off.

5 Claims, 2 Drawing Figures

CHARACTER DISPLAY DEVICE

BACKGROUND OF THE INVENTION

1. Field of the Invention

The invention relates to a character display device comprising a storage circuit for storing information concerning characters to be displayed by means of display elements.

2. Description of the Prior Art

In "Electronics" Apr. 26, 1973, pages 95–99, FIG. 3 in particular, a character display device of the above-mentioned kind is disclosed in which a quasi static display is obtained showing a continuous dislay state for the character to be displayed. For each character the storage circuit comprises a storage device, the contents of which is only changed at moments that other information becomes available for display. Because no scanning of the character to be displayed occurs, this circuit produces few noise signals, which substantially only occur at the above moments.

SUMMARY OF THE INVENTION

It is an object of the invention to provide other measures for avoiding the generation of noise signals which, furthermore, can also be used for other display systems than quasi-static systems.

A character display device of the kind mentioned in the preamble according to the invention is therefore characterized in that the character display device comprises, to prevent the generating of noise signals, a circuit for periodically gradually switching on and off of display elements driven in a display state, while the storage circuit is arranged for writing new information therein in an off state of the display elements.

A character display device according to the invention is particularly suitable for use in or in the vicinity of apparatus which are sensitive to noise signals such as for example, radio or television receivers.

The measures according to the invention prevent transient changes in the state of the display elements such as, for example, large sudden current changes in light-emitting diodes or voltage changes at gas-discharge cells.

BRIEF DESCRIPTION OF THE DRAWINGS

The invention will be explained in detail with reference to the drawing, in which.

DESCRIPTION OF THE PREFERRED EMBODIMENT

Figure 1:
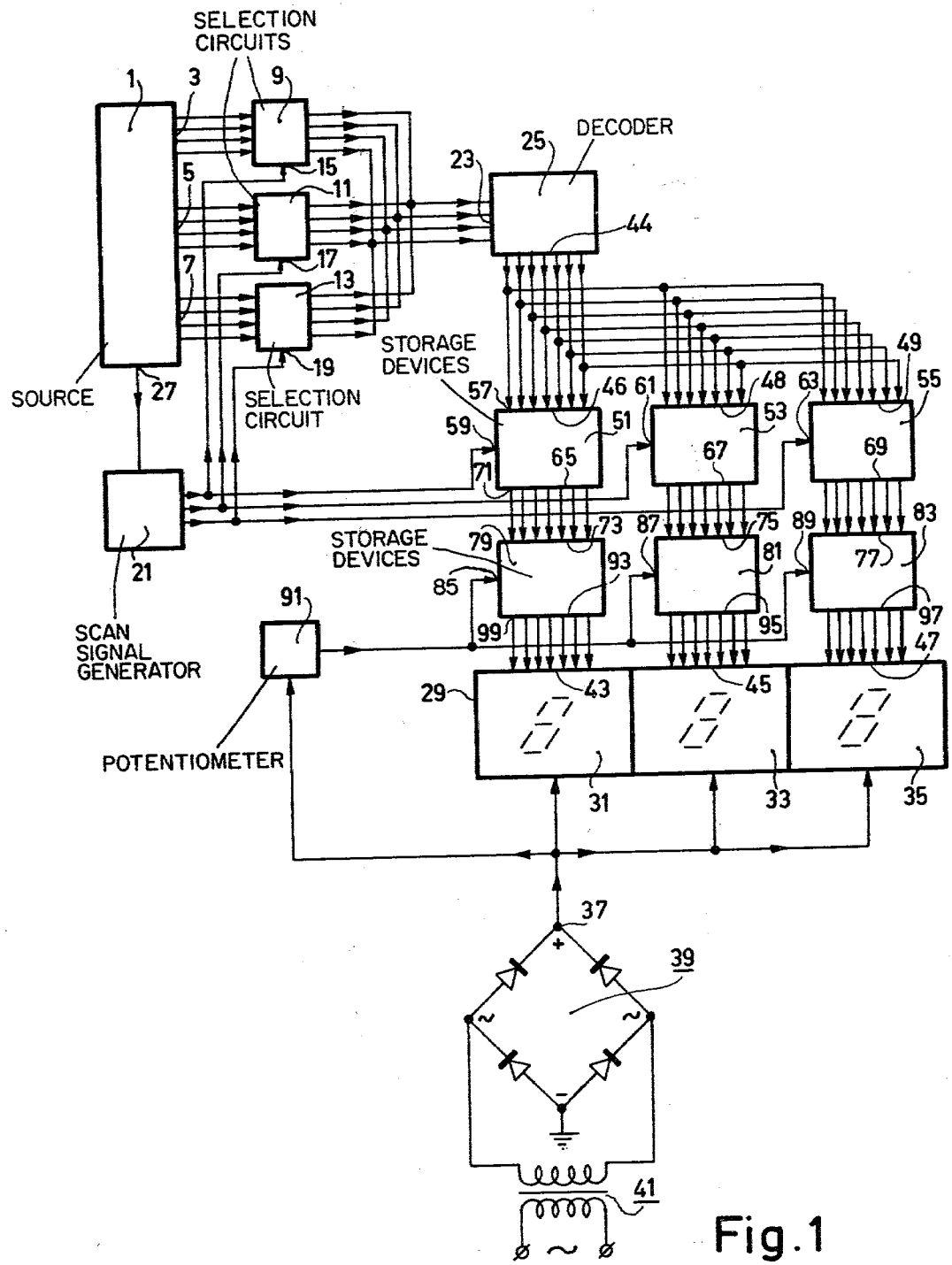
FIG. 1 shows a block diagram of a character display device according to the invention and FIG. 2 shows a number of wave forms of signals as they occur in the device according to FIG. 1.

In FIG. 1 an information source 1 supplies through three groups of four outputs 3, 5, or 7 respectively, binary coded information regarding three characters to be displayed to three selection circuits 9, 11, or 13 respectively. Under the influence of a scanning signal which is supplied to an input 15, 17, or 19 respectively and which is derived from a scanning signal generator 21 one of the selection circuits 9, 11 or 13 conducts alternately. A group 23 of inputs of a decoder circuit 25 is then connected alternatingly to one of the groups of outputs 3, 5, 7 of the information source 1.

The scanning signal generator 21 receives a synchronization signal from an output 27 of the information source 1. The information source 1 may, for example, be a tuning circuit of a receiver, of which, for example, the frequency or the channel to which the receiver has been tuned must be displayed on a display panel 29 comprising the display parts 31, 33, 35. For simplicity the number of characters to be displayed is here assumed to be three, but there are of course other possibilities.

The display parts 31, 33, 35 each comprise seven line shaped display elements which have a common electrode and which are connected to a + terminal 37 of a non-smoothed rectifier circuit 39 a negative terminal of which is connected to earth and two further terminals of which are connected to the secondary of a transformer 41 which is supplied by an alternating voltage. A further electrode of each linear display element is connected to an input of three groups of inputs 43, 45, or 47 respectively.

The manner in which a display of characters is obtained is the following.

Figure 2:
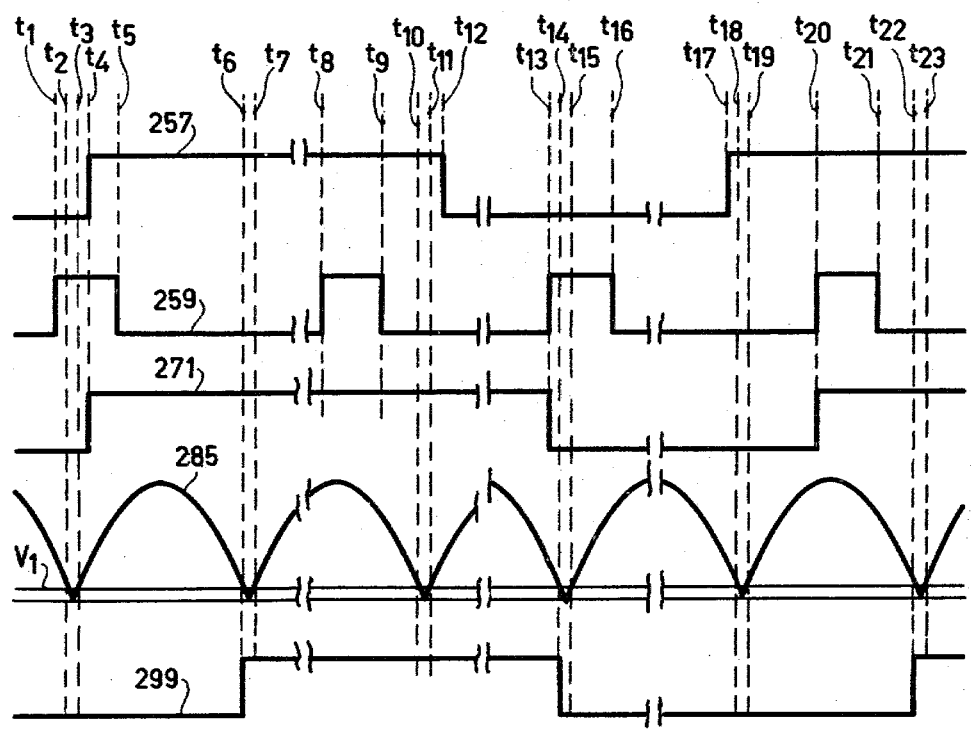

Signals are obtained from a group 44 of seven outputs of the decoder circuit 25 in a code which is suitable for display, which signals are supplied to three groups 46, 48, or 49 respectively of three first storage devices 51, 53, or 55 respectively. Reference 257 in FIG. 2 shows the waveform of the signal of an input 57 of the group 46. The signals at the groups of inputs 46, 48, 49 are alternately written into the storage devices 51, 53, 55 if a write-in control signal input 59 or 61, 63 respectively of the storage devices is positive. The signals for these inputs 59, 61 and 63 are obtained from the scanning signal generator 21. The waveform 259 in FIG. 2 illustrates the signal at the input 59.

Each of the first storage devices 51, 53, 55 has a group of seven outputs 65, 67, or 69 respectively at which the signal combinations written into these storage devices are continuously available. Reference 271 in FIG. 2 shows the signal waveform of an input 71.

The output groups 65, 67, 69 are connected to groups of inputs 73, 75, and 77, respectively of a second storage device 79, 81, and 83 respectively. A write-in signal input 85, 87, or 89 respectively is connected to the + terminal 37 of the rectifier circuit 39 through an amplitude correction circuit 91, for example a potentiometer.

Reference 285 in FIG. 2 illustrates the waveform of the signal at the input 85.

The second storage devices 79 81, or 83 respectively each have a group of seven outputs 93 95, or 97 respectively which, after a suitable level has occurred in the write-in signal at the inputs 85, 87, 89 take over the output signal combination from the groups of outputs 65, 67, 69 of the first storage devices 51, 53, 55. This is invariably done at a moment at which the common electrodes of the display parts 31, 33, 35 carry an insufficient voltage to keep the display elements in the current-carrying state as will be discussed hereinafter.

An output 99 of the group 93 carries a signal wave form indicated by 299 in FIG. 2.

The waveform 285 also occurs as the common electrodes of the display parts 31, 33, 35.

The operation of the circuit of FIG. 1 will now be explained with reference to FIG. 2.

The decoder circuit 25 supplies the signal 257 to the input 57 of the first storage device 51 which signal changes from low to high at the instants $t_4$ and $t_{17}$ and from high to low at the instant $t_{12}$. Only during the period that the signal at its write-in signal input 59 is high, which is between $t_1$ and $t_5$, $t_8$ and $t_9$, $t_{13}$ and $t_{16}$, and $t_{20}$ and $t_{21}$ the first storage device 51 can store the signal value at its input 57 and keeps it available at its corresponding output 71 until a new value is written in. So at the instant $t_4$ which is located in the period $t_1$-$t_5$ the signal 271 changes from low to high, remains high until $t_{13}$ because the signal 257 is still high in the period $t_8$-$t_9$ and gets low again at $t_{13}$ because there the signal 257 is low. At $t_{20}$ the signal 271 becomes high again.

The second storage device 79 can only take over a signal value from its input 71 if the voltage at its wirte-in signal input 85 drops below a threshold voltage $V_1$ i.e. in the period $t_2$-$t_3$, $t_6$-$t_7$, $t_{10}$-$t_{11}$, $t_{14}$-$t_{15}$, $t_{18}$-$t_{19}$, and $t_{22}$-$t_{23}$. So the voltage 299 at the output 99 remains low until $t_6$ and then gets high until $t_{13}$ whereafter the voltage remains low until $t_{22}$ whereafter it becomes high again. The jumps in the signal value occur at the instants $t_6$, $t_{14}$, $t_{22}$ at which also the voltage at the common electrodes of the display panel 29 is low so that they carry no current and no jumps in the current through the display elements due to changes in signs to be displayed can occur. This prevents the occurrence of noise signals by the change of information to be displayed. Because furthermore the voltage at the common electrodes has no steep edges when the display elements are switched on or off also this does not produce noise signals so that a display circuit is obtained which can be used in apparatus which are sensitive for noise signals, such as, for example, radio receivers.

In the embodiment described the transformer 41 may be supplied with a line voltage of, for example, 50 or 60 Hz.

It is also possible to obtain a so-called dynamic display if the common electrodes of the display parts 31, 33, 35 are alternately controlled instead of simultaneously as described above. Then only one first and one second storage device need to be used while the write-in signal of the first storage device can then also be supplied by the rectifier circuit 39 in such a way that information is first written into this first storage device before it is written into the second storage device. Then the rectifier circuit 39 must be supplied with a modified frequency. It has appeared that when light-emitting diodes are used as display elements this frequency may be increased to approximately 1 kHz, while the current change through the diodes remains less than 250 A/sec., without interference becoming noticeable in the long wave range of a radio receiver. The common electrodes may be controlled through an emitter follower.

If a so-called static display is used in which each display element has its own decoder circuit then one storage circuit per display part will do if the information to be displayed is continuously available. The frequency of the voltage which feeds the rectifier circuit may be low then.

It will be clear, that, if so desired, other waveforms can be used for switching the display segments on and off and for writing information into the storage circuit as long as the said conditions are satisfied.

The display parts may have another construction than indicated above, so, for example, display parts of a matrix type having punctiform radiating elements may be used.

Evidently, it is possible to choose, if so desired, another place for the decoder circuit then indicated in the example.

What is claimed is:

1. A character display device comprising:
    a first digital storage means for storing the information of characters to be displayed; a display means;
    information input means connected to an input of said first digital storage means;
    a throughput means;
    an output of said first digital storage means being connectable to an information input of said display means by way of a throughput means;
    a control circuit connected to said display means for cycling said display means through successive cycles between a maximum display characteristic and a minimum display characteristic while maintaining predetermined maxima for the temporal variations in display actuation;
    synchronizing means having a control input connected to an output of said control circuit and an output connected to said throughput means for controlling transmission of modified information to said first digital storage means, only starting from a predetermined phase of said control circuit.

2. A character display device as claimed in claim 1, wherein said synchronizing means is operative for giving a drive signal substantially upon minimum display actuation times.

3. A character display device as claimed in claim 1, wherein said control circuit comprises a substantially non-smoothed AC-voltage rectifier circuit.

4. A character display device according to claim 3, wherein said synchronizing means is adapted for driving said throughput means for successive current minima.

5. A character display device as claimed in claim 4, wherein:
    said first storage means is adapted for continually storing character information upon reception thereof; and wherein
    said throughput means comprises a second digital storage means adapted for taking over the information from said first storage means upon reception of a signal from said sychronizing means and for continually delivering its output signals to said display means.

* * * * *